(12) United States Patent
Yamaguchi

(10) Patent No.: US 6,504,451 B1
(45) Date of Patent: Jan. 7, 2003

(54) MULTI-LAYERED LC COMPOSITE WITH A CONNECTING PATTERN CAPACITIVELY COUPLING INDUCTORS TO GROUND

(75) Inventor: Naoto Yamaguchi, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/722,756

(22) Filed: Nov. 27, 2000

(30) Foreign Application Priority Data

Nov. 26, 1999 (JP) ............................................. 11-336657

(51) Int. Cl.⁷ ............................. H03H 7/09; H01P 1/203
(52) U.S. Cl. ...................... 333/177; 333/185; 333/204
(58) Field of Search ................................ 333/175, 177, 333/185, 204

(56) References Cited

U.S. PATENT DOCUMENTS 5,448,209 A * 9/1995 Hirai et al. .................. 333/204

FOREIGN PATENT DOCUMENTS

| EP | 641035 A2 | * 3/1995 | .................. 333/204 |
| JP | 05275903 A | * 10/1993 | .................. 333/204 |

* cited by examiner

Primary Examiner—Justin P. Bettendorf
(74) Attorney, Agent, or Firm—Keating & Bennett, LLP

(57) ABSTRACT

A multi-layered LC composite component achieves greatly increased attenuation in the proximity of a central frequency without increasing insertion loss. In the arrangement of the multi-layered LC composite component, an end of each of inductor patterns is connected to a connecting pattern to be short-circuited. These inductor patterns define inductors. Frequency-adjusting capacitor patterns are opposed to open-circuited ends of the inductor patterns to define capacitors. As a result, the capacitors and the inductors define LC resonators. The connecting pattern is opposed to shield patterns via insulating sheets to define a common capacitor.

10 Claims, 9 Drawing Sheets

MULTI-LAYERED LC COMPOSITE WITH A CONNECTING PATTERN CAPACITIVELY COUPLING INDUCTORS TO GROUND

BACKGROUND OF THE INVENTION

1. Field of the Invention

The present invention relates to multi-layered LC composite components, and more particularly relates to multi-layered LC composite components included in high-frequency bands.

2. Description of the Related Art

A conventional multi-layered LC filter is shown in each of FIGS. 15 and 16. As shown in FIG. 15, a multi-layered LC filter 1 includes a ceramic sheet 4 having inductor patterns 7 and 8 and frequency-adjusting capacitor patterns 9 and 10 provided thereon, and ceramic sheets 3 and 5 having shield patterns 12 and 13 provided thereon, and a ceramic sheet 2.

The ceramic sheets 2 to 5 are laminated and subsequently integrally fired to define a multi-layered structure 15 shown in FIG. 16. On the multi-layered structure 15, an input terminal 16, an output terminal 17, and ground terminals G1 and G2 are provided. The input terminal 16 is connected to a leading portion 7a of the inductor pattern 7. The output terminal 17 is connected to a leading portion 8a of the inductor pattern 8. The ground terminal G1 is connected to an end of each of the frequency-adjusting capacitor patterns 9 and 10 and the shield patterns 12 and 13. The ground terminal G2 is connected to a grounded end portion of each of the inductor patterns 7 and 8 and the other end of each of the shield patterns 12 and 13.

In the above LC filter 1, both an inductor defined by the inductor pattern 7 and a capacitor defined by the frequency-adjusting capacitor pattern 9 opposed to an open end portion of the inductor pattern 7 constitute an LC resonator Q1. Similarly, both an inductor defined by the inductor pattern 8 and a capacitor defined by the frequency-adjusting capacitor pattern 10 opposed to an open end portion of the inductor pattern 8 constitute an LC resonator Q2.

When the GHz-band LC filter 1 having the structure shown in each of FIGS. 15 and 16 is produced, an attenuation pole is provided on the high-frequency side of a central frequency. However, to increase the amount of attenuation in the proximity of the central frequency, when another attenuation pole is added on the high-frequency side of the central frequency, for example, in the proximity of a central frequency $F_0+0.12$ GHz, it is not possible to achieve the increased attenuation. In addition, when a plurality of attenuation poles is added in the proximity of the central frequency, increased insertion loss occurs.

SUMMARY OF THE INVENTION

To overcome the above-described problems, preferred embodiments of the present invention provide a multi-layered LC composite component that greatly increases the amount of attenuation in the proximity of a central frequency without increasing an insertion loss.

According to a first preferred embodiment of the present invention, a multi-layered LC composite component includes a multi-layered structure including laminated insulating layers, a plurality of inductors and a plurality of capacitors provided inside of the multi-layered structure, a plurality of LC resonators defined by the plurality of inductors and the plurality of capacitors, wherein an end of each inductor conductor constituting the plurality of inductors is electrically connected via a connecting electrode, and the end of each inductor conductor is grounded via a capacitor defined by capacitor electrodes, one of which is the connecting electrode.

Furthermore, according to a second preferred embodiment of the present invention, a multi-layered LC composite component includes a multi-layered structure including laminated insulating layers, a plurality of inductors and a plurality of capacitors provided inside of the multi-layered structure, a plurality of LC resonators defined by the plurality of inductors and the plurality of capacitors, wherein the plurality of inductors is defined by via holes which are connected in a laminating direction of the insulating layers, an end of the respective inductors is electrically connected via a connecting electrode, the end of the respective inductors is grounded via a capacitor defined by capacitor electrodes, one of which is the connecting electrode, and the other end of the respective inductors is electrically connected to a capacitor electrode of the respective capacitors of the LC resonators.

The ends of the inductor conductors are short-circuited and comb-line coupled to each other by the connecting electrode, and are also grounded via the capacitor. With this arrangement, a plurality of attenuation poles is provided in the proximity of a central frequency, thereby the attenuation characteristics in the proximity of the central frequency are greatly improved.

Other features, characteristics, elements and advantages of the present invention will become apparent from the following description of preferred embodiments thereof with reference to the attached drawings.

DETAILED DESCRIPTION OF PREFERRED EMBODIDMENTS

Referring to the attached drawings, a description will be provided of preferred embodiments of a multi-layered LC composite component according to the present invention.

Figure 1:
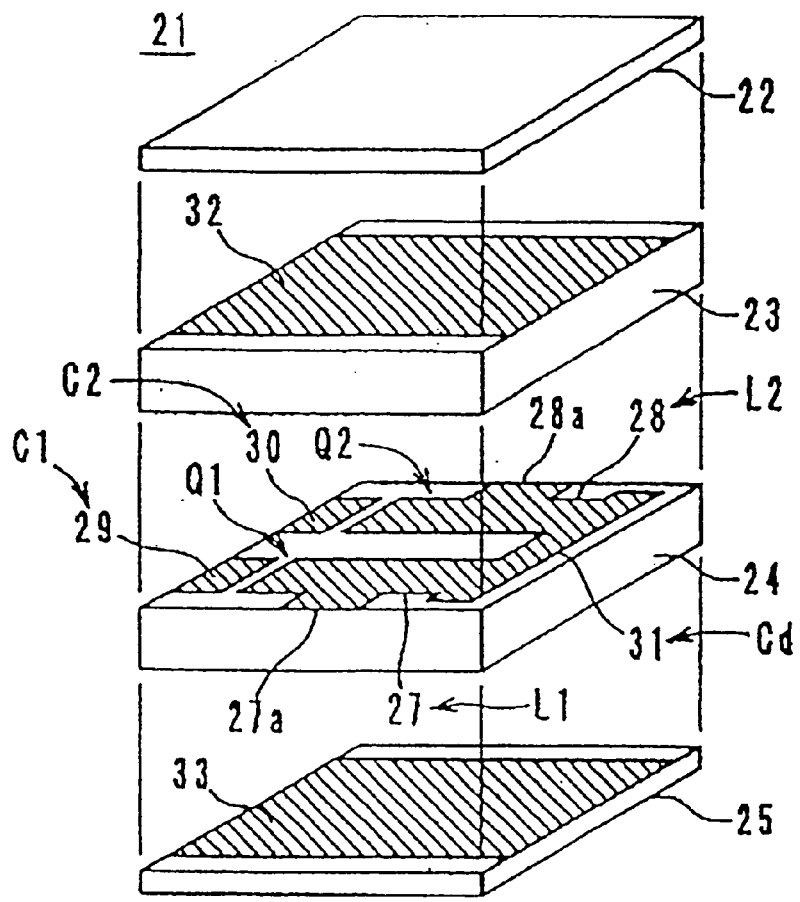
FIG. 1 is an exploded perspective view of a multi-layered LC composite component according to a first preferred embodiment of the present invention.
Figure 2:
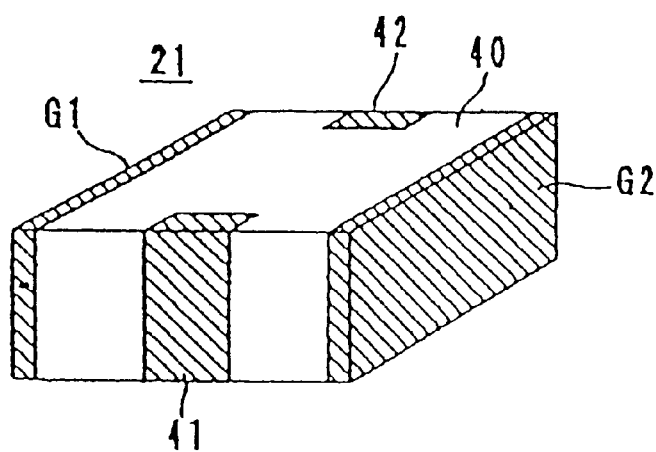
FIG. 2 is a perspective view of the multi-layered LC composite component shown in FIG. 1.
Figure 3:
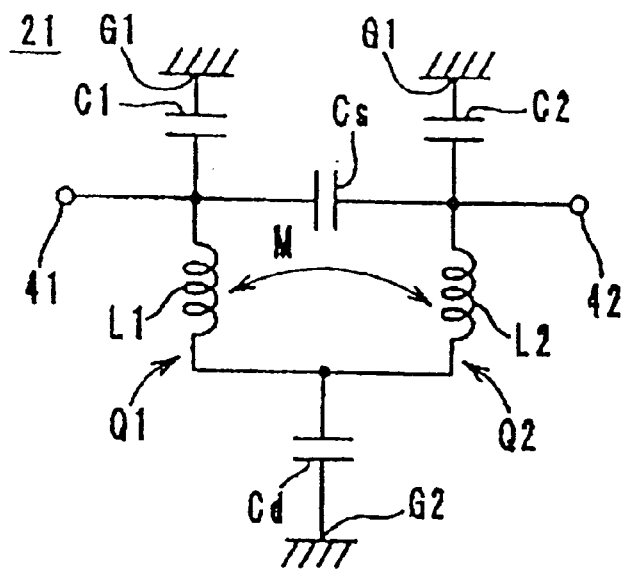
FIG. 3 is an electrically equivalent circuit diagram of the multi-layered LC composite component shown in FIG. 1.

FIG. 1 shows the structure of a multi-layered LC composite filter 21 according to a first preferred embodiment of the present invention. FIG. 2 shows a perspective view of the LC filter 21, and FIG. 3 shows an electrically equivalent circuit diagram thereof. The LC filter 21 is a two-stage filter having LC resonators Q1 and Q2.

As shown in FIG. 1, the multi-layered LC filter 21 includes an insulating sheet 24 having inductor patterns 27 and 28, frequency-adjusting capacitor patterns 29 and 30, and a connecting pattern 31 provided thereon, an insulating sheet 23 having a shield pattern 32 provided thereon, an insulating sheet 25 having a shield pattern 33 provided thereon, and an insulating sheet 22. The insulating sheets 22 to 25 are formed by mixing a dielectric powder and a magnetic powder with a binding agent. The patterns 27 to 33 are formed preferably of a material such as Ag, Pd, Cu, Ni, Au, Ag—Pd, or other suitable material, and the patterns are provided on the insulating sheets via printing or other suitable methods.

The linear inductor patterns 27 and 28 having desired pattern widths are arranged such that the inductor patterns 27 and 28 are substantially parallel to each other from the left side of the insulating sheet 24 to the right side thereof. An end of each of the inductor patterns 27 and 28 is connected to the connecting pattern 31 to be short-circuited, and the other ends thereof are open. The inductor patterns 27 and 28 define inductors L1 and L2, respectively. The axes of the inductors L1 and L2 are substantially parallel to the direction from the left edge of the insulating sheet 24 to the right edge thereof. When current flows through each of the inductors L1 and L2, a magnetic field occurs. The magnetic field circulates on a surface that is substantially perpendicular to the axial direction of the inductors L1 and L2 in the periphery of each of the inductors L1 and L2.

A leading portion 27a of the inductor pattern 27 is exposed on the front edge of the sheet 24. A leading portion 28a of the inductor pattern 28 is exposed on the back edge of the sheet 24. The length of each of the inductor patterns 27 and 28 is preferably about λ/4, where the symbol λ represents the wavelength of a central frequency.

The frequency-adjusting capacitor patterns 29 and 30 are arranged on the left side of the sheet 24. The frequency-adjusting capacitor pattern 29 is opposed to the open-circuited end of the inductor pattern 27 to define a capacitor C1. The capacitor C1 and the inductor L1 define an LC resonator Q1. In addition, the frequency-adjusting capacitor pattern 30 is opposed to the open-circuited end of the inductor pattern 28 to define a capacitor C2. The capacitor C2 and the inductor L2 define an LC resonator Q2.

The connecting pattern 31 is opposed to the right side of each of the shield patterns 32 and 33 via the insulating sheets 23 and 24 positioned therebetween to define a common capacitor Cd, respectively. With this arrangement, the short-circuited ends of the inductor patterns 27 and 28 are comb-line coupled by the connecting pattern 31, and are also grounded via the common capacitor Cd. In addition, since the inductor patterns 27 and 28 are arranged to be substantially parallel to each other, a capacitance is generated in the area where the inductor patterns 27 and 28 are opposed to each other. The generated capacitance becomes a coupling capacitor Cs coupling the resonators Q1 and Q2. In addition, a mutual inductance M is generated between the inductor patterns 27 and 28 to magnetically couple the resonators Q1 and Q2. Furthermore, the wide shield patterns 32 and 33 are arranged via the patterns 27 to 31 positioned therebetween.

The insulating sheets 22 to 25 are laminated and subsequently integrally fired to define a multi-layered structure 40 shown in FIG. 2. Ground terminals G1 and G2 are provided on the right and left end surfaces of the multi-layered structure 40. An input terminal 41 is provided on the front surface of the multi-layered structure 40, and an output terminal 42 is provided on the back surface thereof.

The input terminal 41 is connected to the leading portion 27a of the inductor pattern 27, and the output terminal 42 is connected to the leading portion 28a of the inductor pattern 28. The ground terminal G1 is connected to each of the frequency-adjusting capacitor patterns 29 and 30, and an end portion of each of the shield patterns 32 and 33, respectively. The ground terminal G2 is connected to the other end portion of each of the shield patterns 32 and 33.

Figure 4:
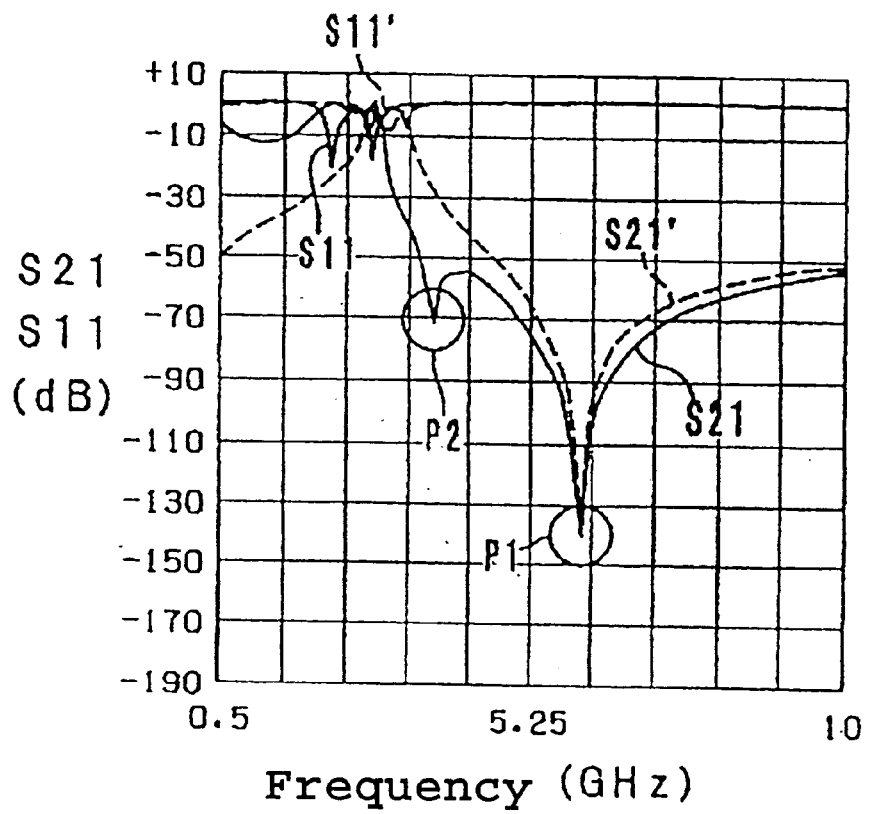
FIG. 4 is a graph showing the band pass characteristics and reflection characteristics of the multi-layered LC composite component shown in FIG. 1.

FIG. 3 is an electrically equivalent circuit diagram of the multi-layered LC filter 21 obtained by the above arrangement. The resonators Q1 and Q2 are electromagnetically connected to each other via the coupling capacitor Cs and the mutual inductance M to define a two-stage filter. An end of each of the inductors L1 and L2 of the resonators Q1 and Q2, that is, each of the open-circuited ends of the inductor patterns 27 and 28 is connected to an end of each of the capacitors C1 and C2. The other ends of the capacitors C1 and C2 are grounded. The other ends of the inductors L1 and L2, that is, the short-circuited ends of the inductor patterns 27 and 28 are comb-line coupled to each other and are grounded via the common capacitor Cd. With this arrangement, in the multi-layered LC filter 21, as shown in FIG. 4, two attenuation poles P1 and P2 provided on the high-frequency side of the central frequency. Thus, the attenuation characteristics in the proximity of the central frequency are greatly improved. In FIG. 4, solid curved lines S21 and S11 show the pass band characteristics and reflection characteristics of the LC filter 21. To compare with those of the LC filter 21, the pass characteristics and reflection characteristics of a conventional LC filter are shown by dotted curved lines S21' and S11'. In addition, since the attenuation on the low-frequency side of a filter band is less than that of the conventional LC filter, deterioration of an insertion loss due to narrowing of the frequency band is greatly reduced.

Figure 5:
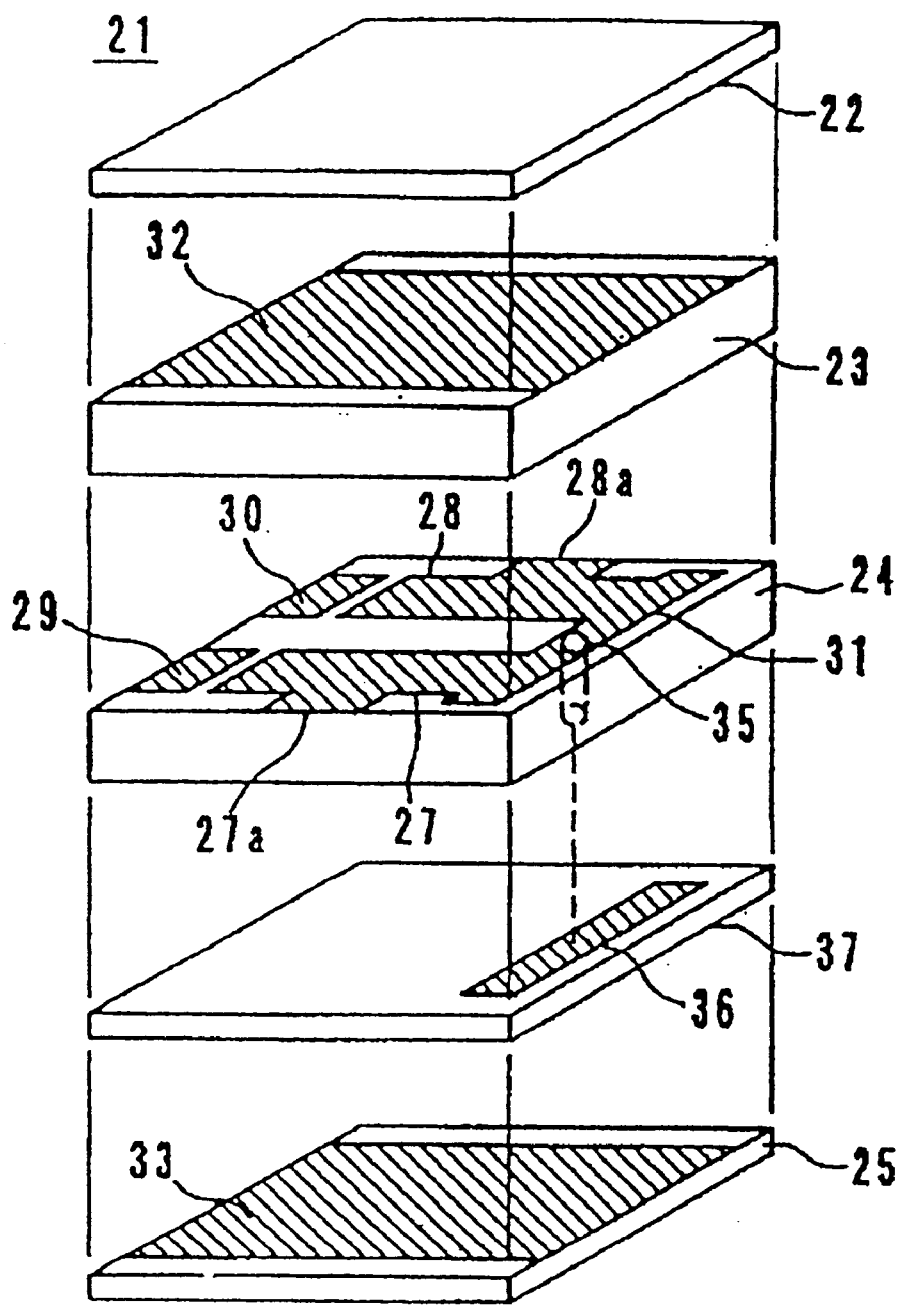
FIG. 5 is an exploded perspective view of a modified example of the multi-layered LC composite component shown in FIG. 1.

In addition, as shown in FIG. 5, in the LC filter 21, to increase the capacitance of the common capacitor Cd, a thin insulating sheet 37 having a capacitor pattern 36 provided thereon is arranged between the insulating sheets 24 and 25 to electrically connect the connecting pattern 31 and the capacitor pattern 36 via a via-hole 35 disposed in the insulating sheet 24. With this arrangement, the distance between the capacitor pattern 36 and the shield pattern 33 is decreased, and an increased capacitance is thereby generated between the capacitor pattern 36 and the shield pattern 33.

Figure 6:
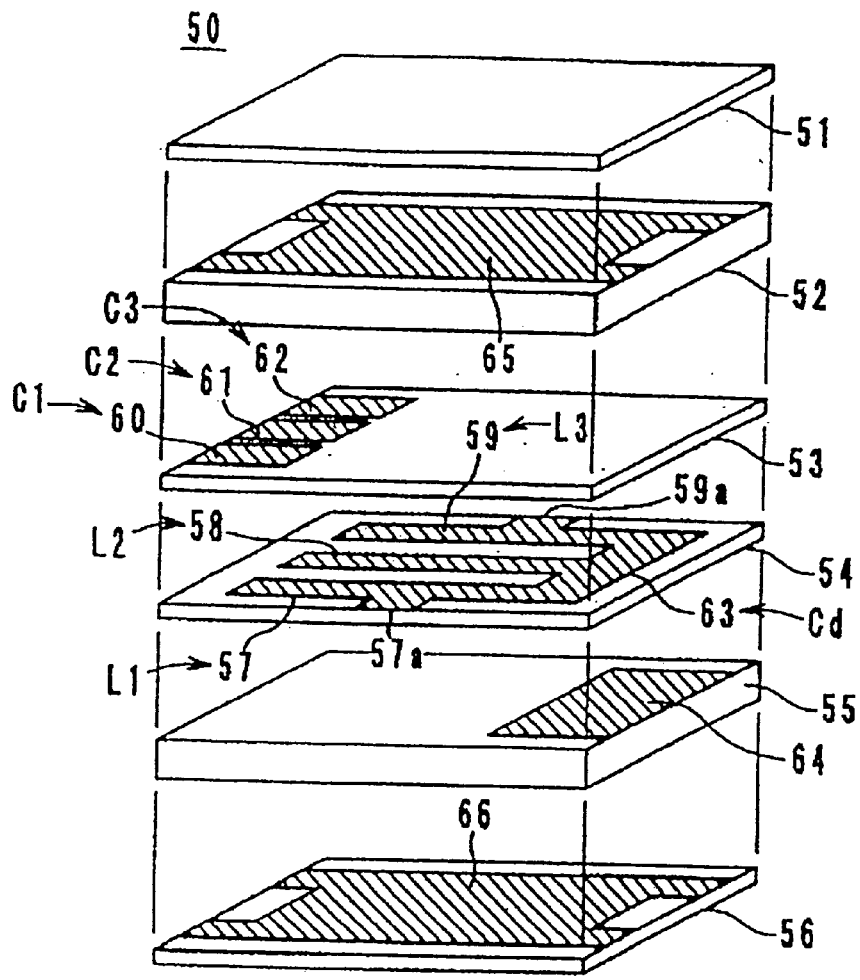
FIG. 6 is an exploded perspective view of a multi-layered LC composite component according to a second preferred embodiment of the present invention.

As shown in FIG. 6, a multi-layered LC filter 50 according to a second preferred embodiment of the present invention includes an insulating sheet 53 having frequency-adjusting capacitor patterns 60 to 62 provided thereon, an insulating sheet 54 having inductor patterns 57, 58, and 59, and a connecting pattern 63 provided thereon, an insulating sheet 55 having a capacitor pattern 64 provided thereon, insulating sheets 52 and 56 having shield patterns 65 and 66 provided thereon, respectively.

The linear inductor patterns 57 to 59 having desired pattern widths are arranged substantially parallel to each other from the left side of the insulating sheet 54 to the right side thereof. An end of each of the inductor patterns 57 to 59 is connected to the connecting pattern 63 to be short-circuited, and the other ends thereof are open-circuited. The inductor patterns 57, 58, and 59 define inductors L1, L2, and L3, respectively. The axes of the inductors L1 to L3 are substantially parallel to the direction from the left side of the insulating sheet 54 to the right side thereof.

A leading portion 57*a* of the inductor pattern 57 is exposed on the front edge of the sheet 54. A leading portion 59*a* of the inductor pattern 59 is exposed on the back edge of the sheet 54. The length of each of the inductor patterns 57 to 59 is preferably about λ/4.

The frequency-adjusting capacitor patterns 60 to 62 are arranged on the left side of the insulating sheet 53. The frequency-adjusting capacitor pattern 60 is opposed to the open-circuited end of the inductor pattern 57 via the sheet 53 to define a capacitor C1. The capacitor C1 and the inductor L1 define an LC resonator Q1. Similarly, the frequency-adjusting capacitor pattern 61 and 62 are opposed to the open-circuited ends of the inductor patterns 58 and 59 via the sheet 53 to define capacitors C2 and C3, respectively. The capacitor C2 and the inductor L2 constitute an LC resonator Q2, and the capacitor C3 and the inductor L3 define an LC resonator Q3.

The connecting pattern 63 is opposed to the capacitor pattern 64 via the insulating sheet 54 positioned therebetween to define a common capacitor Cd. With this arrangement, the short-circuited ends of the inductor patterns 57 to 59 are comb-line coupled via the connecting pattern 63, and are also grounded via the common capacitor Cd.

In addition, since the inductor patterns 57 to 59 are substantially parallel to each other, a capacitance is generated in each of the area where the inductor patterns 57 and 58 are opposed to each other and the area where the inductor patterns 58 and 59 are opposed to each other. This capacitance defines a coupling capacitor coupling the resonators Q1 to Q3. In addition, a mutual inductance is generated between the inductor patterns 57 and 58 and between the inductor patterns 58 and 59, such that the resonators Q1 to Q3 are magnetically coupled to each other. The wide shield patterns 65 and 66 are arranged via the patterns 57 to 64 positioned therebetween.

Figure 7:
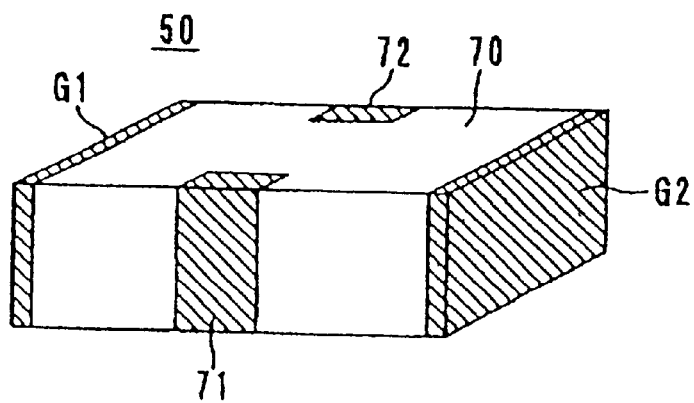
FIG. 7 is a perspective view of the multi-layered LC composite component shown in FIG. 6.

The insulating sheets 51 to 56 are laminated and subsequently integrally fired to define a multi-layered structure 70 shown in FIG. 7. Ground terminals G1 and G2 are provided on the right and left side surfaces of the multi-layered structure 70. An input terminal 71 is provided on the front surface of the multi-layered structure 70, and an output terminal 72 is provided on the back surface thereof.

The input terminal 71 is connected to the leading portion 57*a* of the inductor pattern 57. The output terminal 72 is connected to the leading portion 59*a* of the inductor pattern 59. The ground terminal G1 is connected to each of the frequency-adjusting capacitor patterns 60 to 62 and an end portion of the shield patterns 65 and 66. The ground terminal G2 is connected to the capacitor pattern 64 and the other ends of the shield patterns 65 and 66.

The multi-layered LC filter 50 obtained by the above arrangement defines a three-stage filter. An end of each of the inductors L1 to L3 of the resonators Q1 to Q3, that is, the open-circuited end of each of the inductor patterns 57 to 59, is connected to an end of each of the capacitors C1 to C3. The other ends of the capacitors C1 to C3 are grounded. The other ends of the inductors L1 to L3, that is, the short-circuited ends of the inductor patterns 57 to 59, are comb-line coupled, and are also grounded via the common capacitor Cd. With this arrangement, in the multi-layered LC filter 50, two attenuation poles are provided on the high-frequency side of a central frequency, and attenuation characteristics are thereby greatly improved in the proximity of a central frequency.

Figure 8:
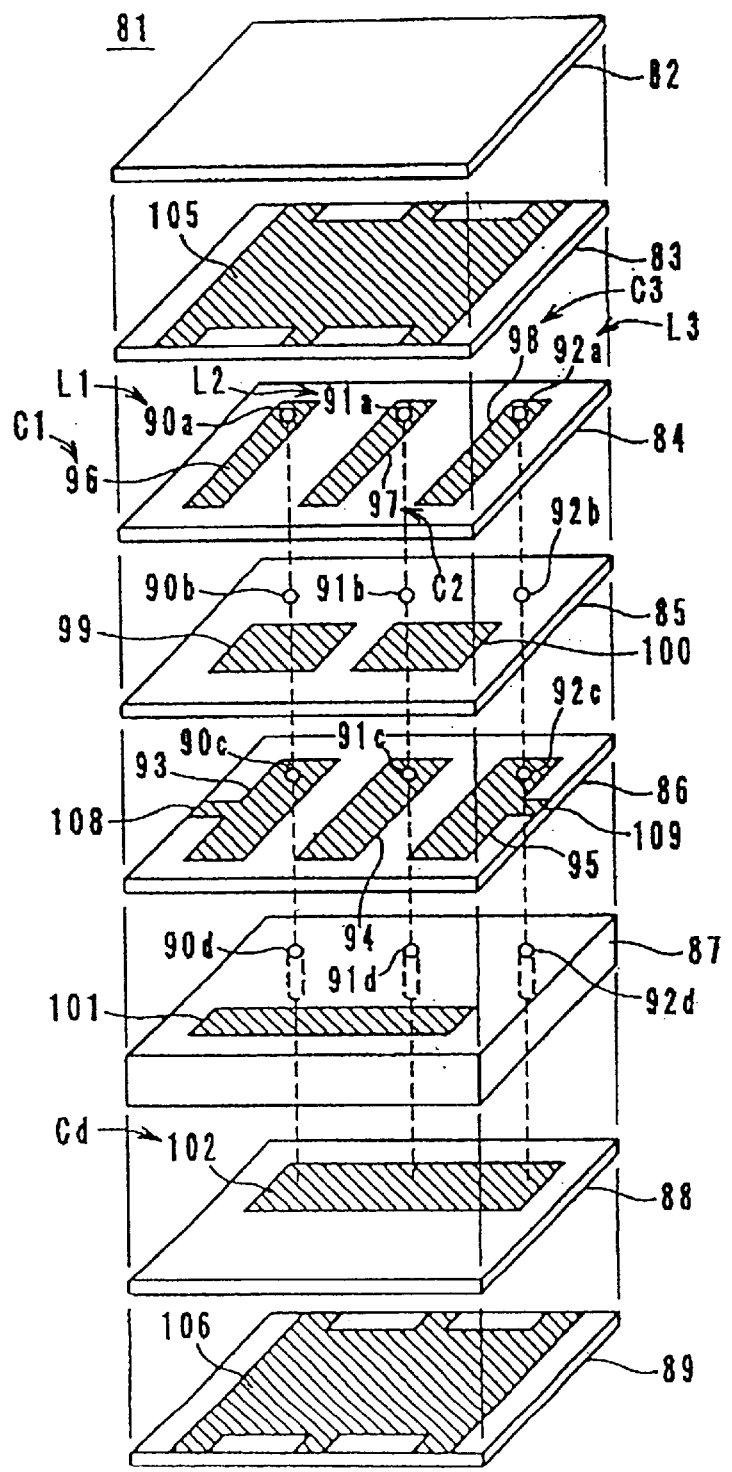
FIG. 8 is an exploded perspective view of a multi-layered LC composite component according to a third preferred embodiment of the present invention.

As shown in FIG. 8, a multi-layered LC filter 81 according to a third preferred embodiment of the present invention includes insulating sheets 82 to 89 having inductor via-holes 90*a* to 90*d*, 91*a* to 91*d*, and 92*a* to 92*d*, capacitor patterns 93 to 95, frequency-adjusting capacitor patterns 96 to 98, coupling capacitor patterns 99 to 101, a connecting pattern 102, shield patterns 105 and 106 provided thereon.

The inductor via-holes 90*a* to 90*d*, 91*a* to 91*d*, and 92*a* to 92*d* are linked in a direction in which the insulating sheets 84 to 87 are laminated to define columnar inductor L1, L2, and L3. The axial directions of the inductors L1 to L3 are substantially perpendicular to the surfaces of the sheets 84 to 87. An end of each of the inductors L1 to L3, that is, the via-holes 90*d*, 91*d*, and 92*d*, are connected to the connecting pattern 102 to be short-circuited.

The frequency-adjusting capacitor patterns 96, 97, and 98 are opposed to the shield pattern 105 via the insulating sheet 83 positioned therebetween to define capacitors C1, C2, and C3. The frequency-adjusting capacitor pattern 96 is directly connected to an end portion of the inductor L1, which is the via-hole 90*a*, and the inductor L1 and the capacitor C1 define an LC resonator Q1. The frequency-adjusting capacitor pattern 97 is directly connected to an end portion of the inductor L2, which is the via-hole 91*a*, and the inductor L2 and the capacitor C2 define an LC resonator Q2. The frequency-adjusting capacitor pattern 98 is directly connected to an end portion of the inductor L3, which is the via-hole 92*a*, and the inductor L3 and the capacitor C3 define an LC resonator Q3.

The connecting pattern 102 is opposed to the shield pattern 106 via the insulating sheet 88 positioned therebetween to define a common capacitor Cd. With this arrangement, the short-circuited ends of the inductors L1 to L3 are comb-line coupled by the connecting pattern 102, and are also grounded via the common capacitor Cd.

The capacitor patterns 93 to 95 provided on the insulating sheet 86 are substantially parallel to each other in a direction from the front edge of the sheet 86 to the back edge thereof. The capacitor patterns 93, 94, and 95 are directly connected to the via-holes 90*c*, 91*c*, and 92*c* defining the inductors L1, L2, and L3. In addition, the capacitor patterns 93 and 95 are connected to an input-leading pattern 108 and an output-leading pattern 109, respectively. The input-leading pattern 108 is exposed on the left edge of the sheet 86, and the output-leading pattern 109 is exposed on the right edge thereof.

The capacitor patterns 93 and 94 are opposed to the coupling capacitor pattern 99 via the sheet 85 positioned therebetween to define a coupling capacitor Cs1 for coupling the LC resonators Q1 and Q2. The capacitor patterns 94 and 95 are opposed to the coupling capacitor pattern 100 via the sheet 85 positioned therebetween to define a coupling capacitor Cs2 for coupling the LC resonators Q2 and Q3. In addition, the coupling capacitor pattern 101 is opposed to an area ranging from the input capacitor pattern 93 to the output capacitor pattern 95 to define a coupling capacitor Cs3 for coupling the input side LC resonator Q1 and the output side LC resonator Q3. The position of an attenuation pole is adjusted by changing the capacitance of the coupling capacitor Cs3.

Figure 9:
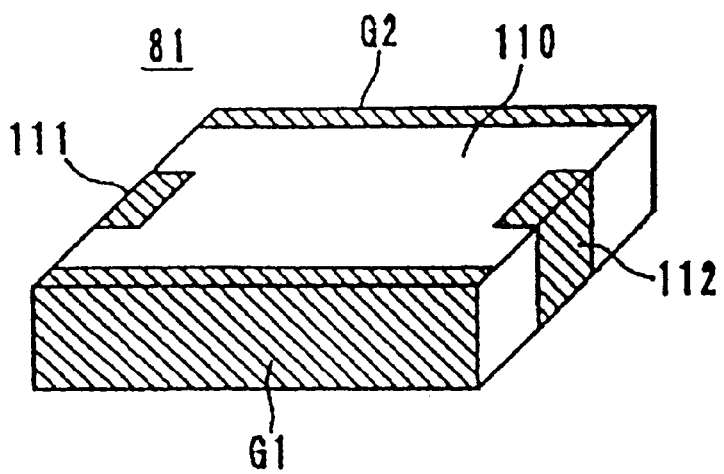
FIG. 9 is a perspective view of the appearance of the multi-layered LC composite component shown in FIG. 8.
Figure 10:
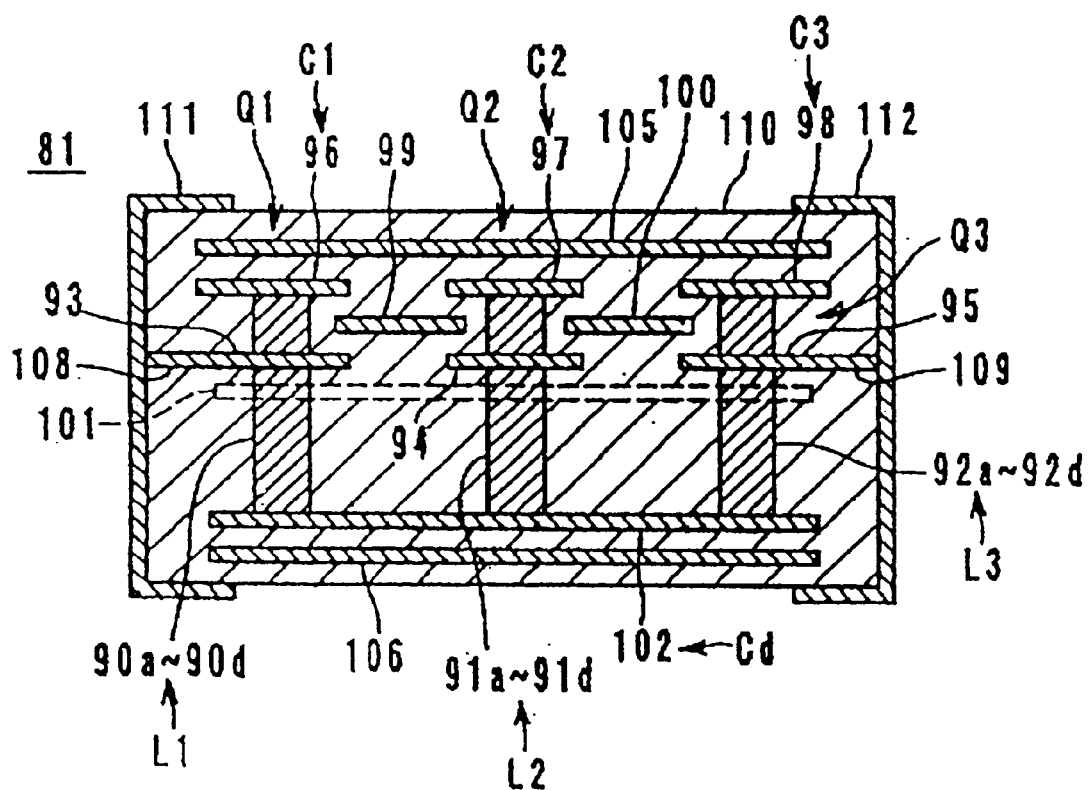
FIG. 10 is a sectional view of the multi-layered LC composite component shown in FIG. 9.

As shown in FIG. 8, the sheets 82 to 89 are sequentially laminated and subsequently integrally fired to define a multi-layered structure 110 shown in FIGS. 9 and 10. An input terminal 111 and an output terminal 112 are provided on the right and left end surfaces of the multi-layered structure 110. Ground terminals G1 and G2 are provided on the front and back surfaces of the multi-layered structure 110. The input terminal 111 is connected to the input-leading pattern 108. The output terminal 112 is connected to the output-leading pattern 109. The ground terminals G1 and G2 are connected to the shield patterns 105 and 106.

Figure 11:
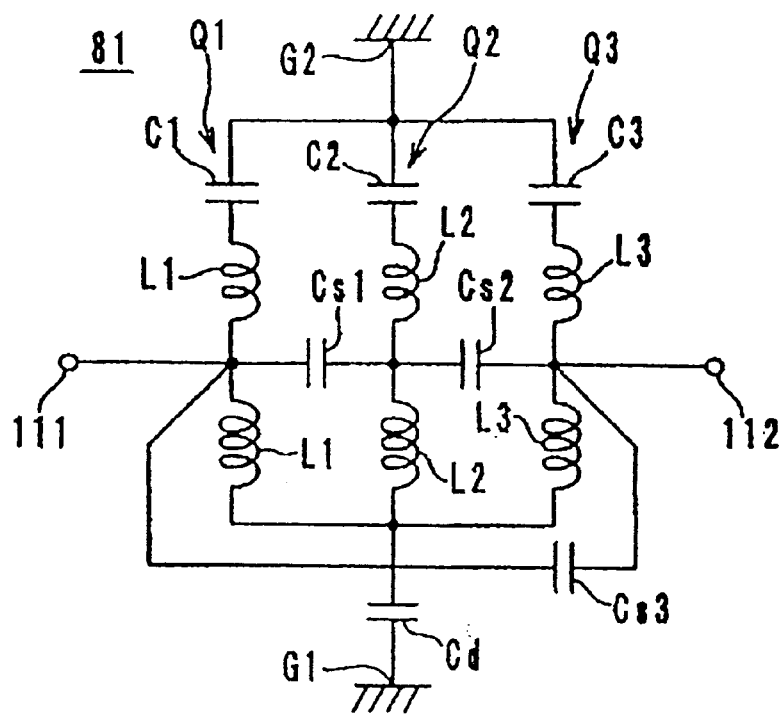
FIG. 11 is an electrically equivalent circuit diagram of the multi-layered LC composite component shown in FIG. 9.
Figure 12:
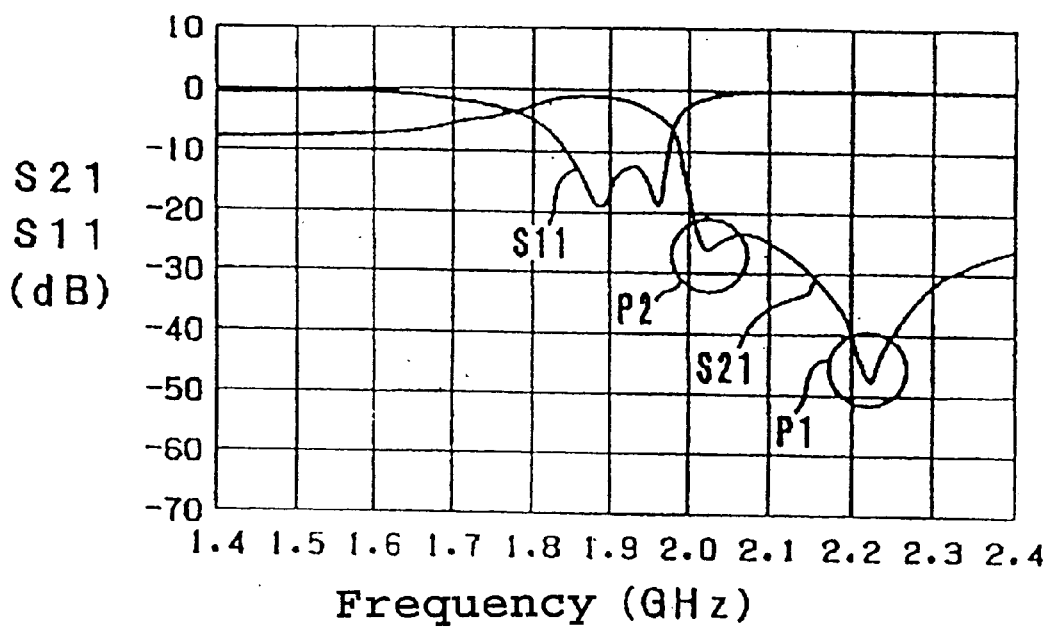
FIG. 12 is a graph showing the band pass characteristics and reflection characteristics of the multi-layered LC composite component shown in FIG. 9.

FIG. 11 is an electrically equivalent circuit diagram of the multi-layered LC filter 81 produced by the above arrangement. The resonators Q1 to Q3 are electrically connected to each other via the coupling capacitors Cs1 to Cs3 to define a Chebyshev-type three-stage filter. An end of each of the inductors L1 to L3 of the resonators Q1 to Q3, that is, each of the via-holes 90a to 92a, is connected to an end of each of the capacitors C1 to C3. The other ends of the inductors L1 to L3, that is, the via-holes 90d to 92d, are comb-line coupled and are also grounded via the common capacitor Cd. With this arrangement, in the multi-layered LC filter 81, as shown in FIG. 12, two attenuation poles P1 and P2 are provided on the high-frequency side of a central frequency ($F_0$=1.8987 GHz). Thus, the attenuation characteristics in the proximity of the central frequency are greatly improved. Furthermore, since the attenuation on the low-frequency side of the filter band is reduced, deterioration of an insertion loss due to narrowing of the band is greatly decreased. More specifically, the insertion loss of the LC filter 81 is 1.41 dB, and the amount of attenuation in the proximity of the central frequency ($F_0$+0.12 GHz) is 26.4 dB. In contrast, the insertion loss of a conventional LC filter is 1.61 dB, and the amount of attenuation in the proximity ($F_0$+0.12 GHz) of a central frequency ($F_0$=1.96 GHz) is 8.3 dB.

Figure 13:
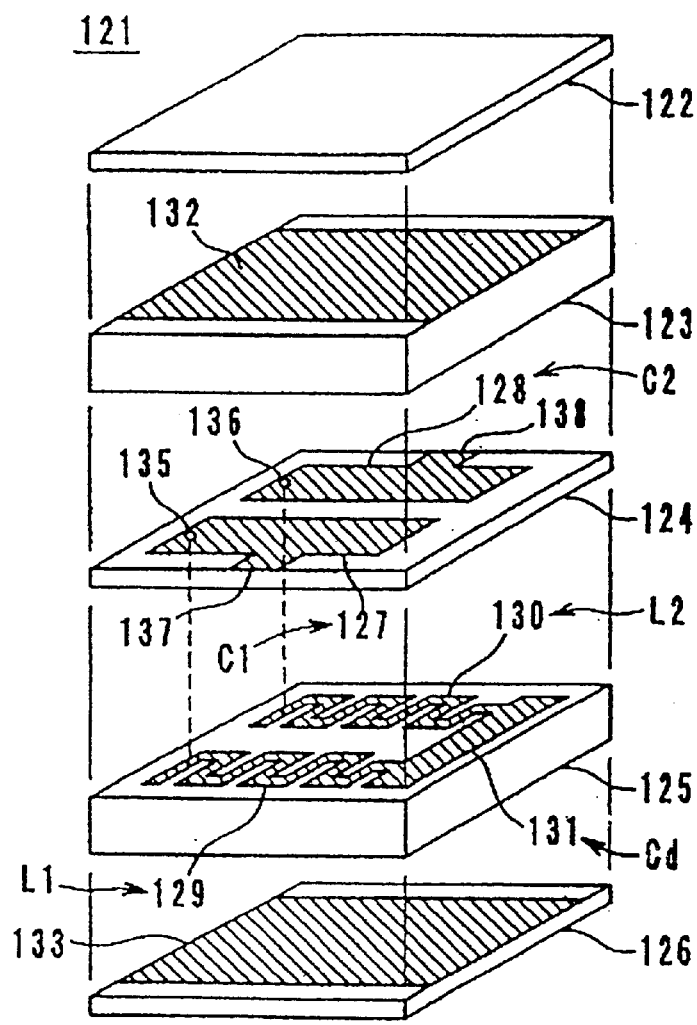
FIG. 13 is an exploded perspective view of a multi-layered LC composite component according to a fourth preferred embodiment of the present invention.

As shown in FIG. 13, a multi-layered LC filter 121 according to a fourth preferred embodiment of the present invention includes insulating sheets 122 to 126 having capacitor patterns 127 and 128, inductor patterns 129 and 130, a connecting pattern 131, and shield patterns 132 provided thereon.

The meandering inductor patterns 129 and 130 provided on the insulating sheet 125 define inductors L1 and L2, respectively. An end of each of the inductor patterns 129 and 130 is connected to the connecting pattern 131 to be short-circuited. The other ends of the inductor patterns 129 and 130 are electrically connected to the capacitor patterns 127 and 128 via via-holes 135 and 136 disposed on the insulating sheet 124.

An end of the capacitor pattern 127 is opposed to a ground terminal G1 (see FIG. 14) to define a frequency-adjusting capacitor C1. The capacitor C1 and the inductor L1 define an LC resonator Q1. An end of the capacitor pattern 128 is opposed to a ground terminal G2 (see FIG. 14) to define a frequency-adjusting capacitor C2. The capacitor C2 and the inductor L2 define an LC resonator Q2.

The connecting pattern 131 is opposed to the right side of the shield pattern 133 via the insulating sheet 125 positioned therebetween to define a common capacitor Cd. With this arrangement, the short-circuited ends of the inductor patterns 129 and 130 are comb-line coupled via the connecting pattern 131, and are also grounded via the common capacitor Cd. Since the capacitor patterns 127 and 128 are opposed to each other on the sheet 124, a capacitance is generated between the capacitor patterns 127 and 128. This capacitance becomes a coupling capacitor Cs for coupling the resonators Q1 and Q2.

Figure 14:
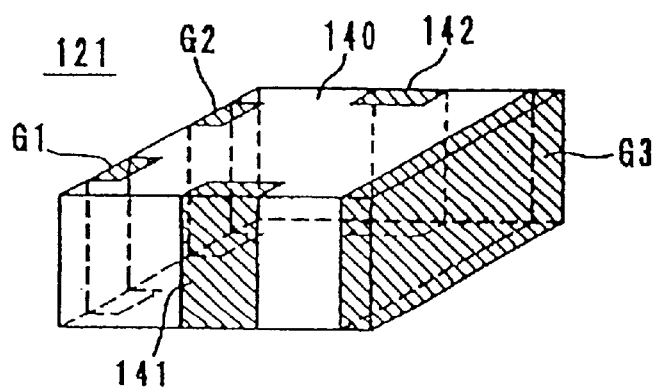
FIG. 14 is a perspective view of the multi-layered LC composite component shown in FIG. 13.
Figure 15:
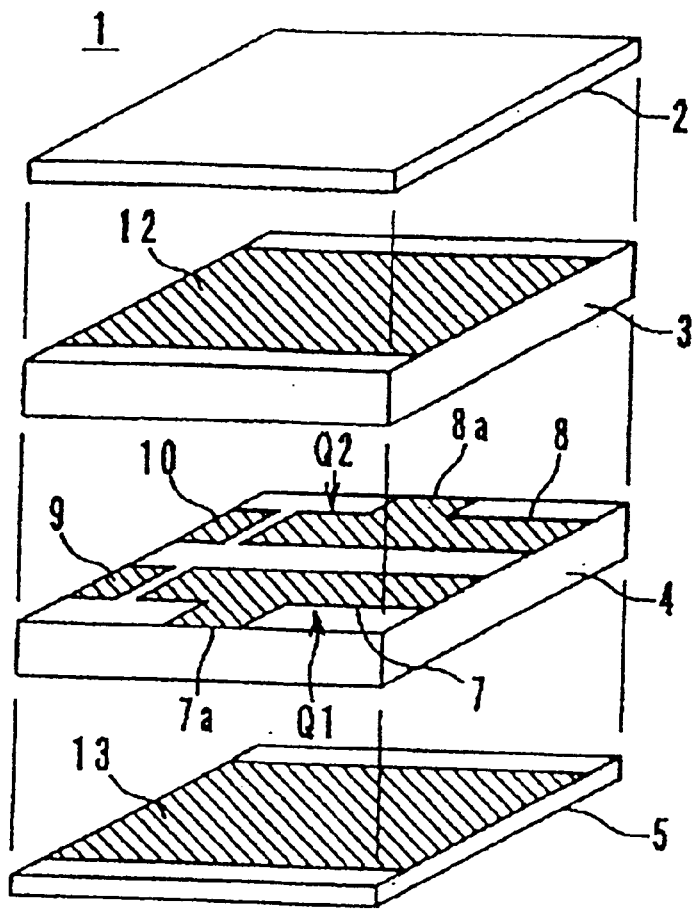
FIG. 15 is an exploded perspective view of a conventional multi-layered LC composite component.
Figure 16:
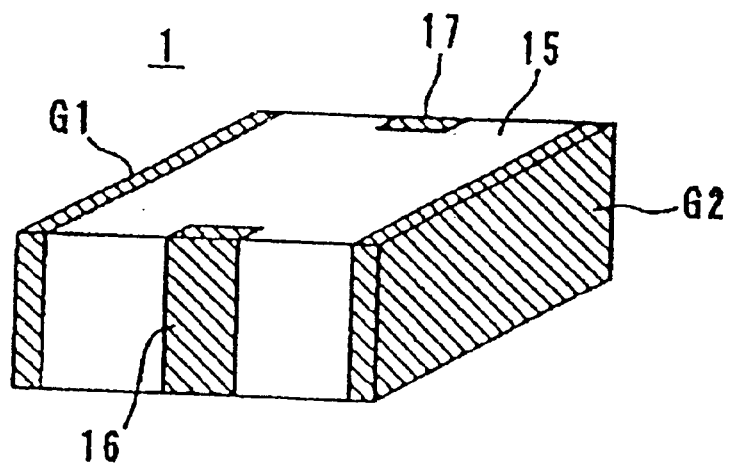
FIG. 16 is a perspective view of the appearance of the multi-layered LC composite component shown in FIG. 15.

The insulating sheets 122 to 126 are laminated and subsequently integrally fired to define a multi-layered structure 140 shown in FIG. 14. Ground terminals G1 and G2 are provided on the left end surface of the multi-layered structure 140, and a ground terminal G3 is provided on the right end surface thereof. An input terminal 141 is provided on the front surface of the multi-layered structure 140, and an output terminal 142 is provided on the back surface thereof.

The input terminal 141 is electrically connected to the capacitor pattern 127 via an input-leading pattern 137. The output terminal 142 is electrically connected to the capacitor pattern 128 via an output-leading pattern 138. The ground terminals G1 to G3 are electrically connected to the shield patterns 132 and 133.

The multi-layered LC filter 121 having the above arrangement provides the same advantages as those obtained in the LC filter 21 of the first preferred embodiment of the present invention.

A multi-layered LC filter according to the present invention is not limited to the examples of the above embodiments. Various modifications and changes can be made within the scope of the invention.

As an LC composite component, there may be a band pass filter, a low pass filter, a high pass filter, or other suitable filter. Furthermore, alternatively, a duplexer defined by combining band pass filters, a duplexer defined by combining low pass filters, high pass filters, or trap circuits, or a duplexer defined by combining these various kinds of circuits may be produced. Furthermore a triplexer, a diplexer, or other suitable devices may be produced, which includes a plurality of filters contained in a single multi-layered structure. For example, a diplexer may be provided including a low pass filter and a high pass filter. In addition, it is also possible to provided a shield pattern which is disposed only in one of the upper part and lower part of the multi-layered structure.

Moreover, in the above preferred embodiments, although the insulating sheets having the conductive patterns and the via-holes provided thereon are integrally fired after being laminated, other methods may be used in the present invention. For example, the insulating sheets may be fired before being laminated. In addition, the LC composite component of various preferred embodiments of the present invention may be produced by the following method. For example, after an insulating layer including a paste insulating material is provided by printing or other suitable methods, a paste conductive material is applied on a surface of the insulating layer to provide a conductive pattern and a via-hole. Next, the paste insulating material is again applied on the layer to provide another insulating layer. Similarly, by applying the paste insulating material in sequence, an LC composite component having a multilayered structure can be produced.

As described above, according to preferred embodiments of the present invention, one-side end of the conductive inductor patterns of the plurality of resonators are comb-line coupled to each other by the connecting electrode, and are also grounded via the capacitor. Therefore, greatly increased attenuation characteristics are achieved in the proximity of the central frequency. Moreover, since the attenuation on the low-frequency side of the frequency band of the filter is greatly reduced, the insertion loss due to narrowing of the frequency band is greatly decreased. As a result, regardless of the narrowed band, a multi-layered LC composite component having a greatly reduced insertion loss and greatly increased attenuation characteristics in the proximity of the central frequency is obtained.

While the preferred embodiments have been described, it is to be understood that modifications will be apparent to those skilled in the art without departing from the scope of the invention, which is to be determined solely by the following claims.

What is claimed is:

1. A multi-layered LC composite component comprising:

a multi-layered structure defined by laminated insulating layers;

a plurality of inductors defined by inductor patterns provided within the multi-layered structure;

a plurality of capacitors defined by capacitor patterns provided within the multi-layered structure;

a plurality of LC resonators defined by the plurality of inductors and the plurality of capacitors; wherein an end of each of said inductor patterns defining the plurality of inductors is electrically connected by a connecting pattern which is defined by one of the capacitor patterns, the end of each of said inductor pattern is grounded via one of said plurality of capacitors defined by said capacitor patterns, one of which is the connecting pattern, and the connecting pattern is directly connected to the end of each of said inductor patterns.

2. The multi-layered LC composite component according to claim 1, wherein at least one of said laminated insulating sheets includes a shield pattern provided thereon.

3. The multi-layered LC composite component according to claim 1, wherein each of said inductor patterns defining the plurality of inductors is linear and substantially parallel to an edge of said multi-layered structure.

4. The multi-layered LC composite component according to claim 1, wherein said inductor patterns are arranged such that a magnetic field generated thereby circulates in a surface that is substantially perpendicular to the axial direction of said inductor patterns.

5. The multi-layered LC composite component according to claim 1, wherein a leading portion of at least one of said inductor patterns is exposed at a front edge of one of said laminated insulating sheets, and a leading portion at least another of said inductor patterns is exposed at a back edge of another of said laminated insulating sheets.

6. The multi-layered LC composite component according to claim 1, wherein at least two of said capacitor patterns are frequency-adjusting patterns.

7. The multi-layered LC composite component according to claim 1, further including ground terminals provided on right and left surfaces of said multi-layered structure.

8. The multi-layered LC composite component according to claim 1, further including an input electrode provided on a front surface of said multi-layered structure, and an output electrode provided on a back surface of said multi-layered structure which is opposite to said front surface.

9. The multi-layered LC composite component according to claim 1, wherein each of said inductor patterns are meandering inductor patterns.

10. The multi-layered LC composite component according to claim 1, wherein an end of each of said plurality of inductors are comb-line coupled to each other and also grounded via a common capacitor.

* * * * *